(12) United States Patent  
Sanjeevarao et al.

(10) Patent No.: US 7,701,785 B2
(45) Date of Patent: Apr. 20, 2010

(54) MEMORY WITH HIGH SPEED SENSING

(75) Inventors: Padmaraj Sanjeevarao, Austin, TX (US); Tahmina Akhter, Austin, TX (US); David W. Chrudimsky, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 102 days.

(21) Appl. No.: 12/144,332

(22) Filed: Jun. 23, 2008

(65) Prior Publication Data

US 2009/0316509 A1   Dec. 24, 2009

(51) Int. Cl.
*G11C 7/00* (2006.01)
(52) U.S. Cl. .................................. 365/189.09; 365/226
(58) Field of Classification Search ............ 365/189.09, 365/226
See application file for complete search history.

(56) References Cited

U.S. PATENT DOCUMENTS

| | | | |
|---|---|---|---|
| 5,777,940 A * | 7/1998 | Su | ............................. 365/226 |
| 5,793,664 A * | 8/1998 | Nagata et al. | ................. 365/72 |
| 5,892,356 A | 4/1999 | Chuang | |

OTHER PUBLICATIONS

Toumazou et al; "Regulated Cascode Switched-Current Memory Cell"; Electronic Letters, vol. 26, Issue 5, Mar. 1990, pp. 303-305.

* cited by examiner

*Primary Examiner*—Michael T Tran
(74) *Attorney, Agent, or Firm*—James L. Clingan, Jr.; David G. Dolezal

(57) ABSTRACT

A memory including a data line, a sense amplifier, and an array of memory cells. The memory includes a transistor for coupling the data line to memory cells of the array for reading. The transistor is biased at a voltage that is higher than a voltage that the data line is biased during precharging. The transistor is part of a regulation circuit. The regulation circuit includes transistors with a higher dielectric breakdown voltage than transistors of the sense amplifier.

18 Claims, 3 Drawing Sheets

US 7,701,785 B2

MEMORY WITH HIGH SPEED SENSING

BACKGROUND

1. Field

This disclosure relates generally to memories, and more specifically, to memories with enhanced sensing speed.

2. Related Art

It is a common desire for memories to have a fast sensing time. The increase in speed, which is reflected in reduced sensing times in a memory is partly facilitated by faster transistors achieved with smaller dimensions such as reduced channel lengths. Achieving faster transistors in this manner, however, also results in transistors with lower breakdown voltages. This in one reason that there has been a trend in integrated circuits to reduce the voltage of the power supply. The lower power supply voltage has the affect of reducing gate voltages and thus reducing the magnitude of the gate to source voltages. The magnitude of the gate to source voltage directly effects the degree of conductivity of the transistors which in turn can reduce speed because it is typical for input capacitances to be a significant factor in speed. Thus the degree of conductivity directly effects the speed with which a capacitive input can be changed. Threshold voltages have been lowered to only a 2 to three tenths of a volt or even lower, which leaves little room for improvement in increasing the magnitude of gate to source voltages by decreasing the threshold voltage.

Thus, there is a need to improve the speed of sensing in memories in light of the reducing power supply voltages commonly used for the high speed transistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a circuit for precharging the bit line of a memory that has a memory cell being read utilizes high voltage transistors and a high voltage that may be used for programming and erasing non-volatile memory cells for increasing the current drive for speeding up the precharging. The reading of memory cells in the memory is faster because the precharge is completed sooner. The regular low voltage transistors generally used for maximizing speed are also utilized in achieving high speed sensing. This is better understood by reference to the drawings and the following specification.

Each signal described herein may be designed as positive or negative logic, where negative logic can be indicated by a "B" as the last letter of the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 1:
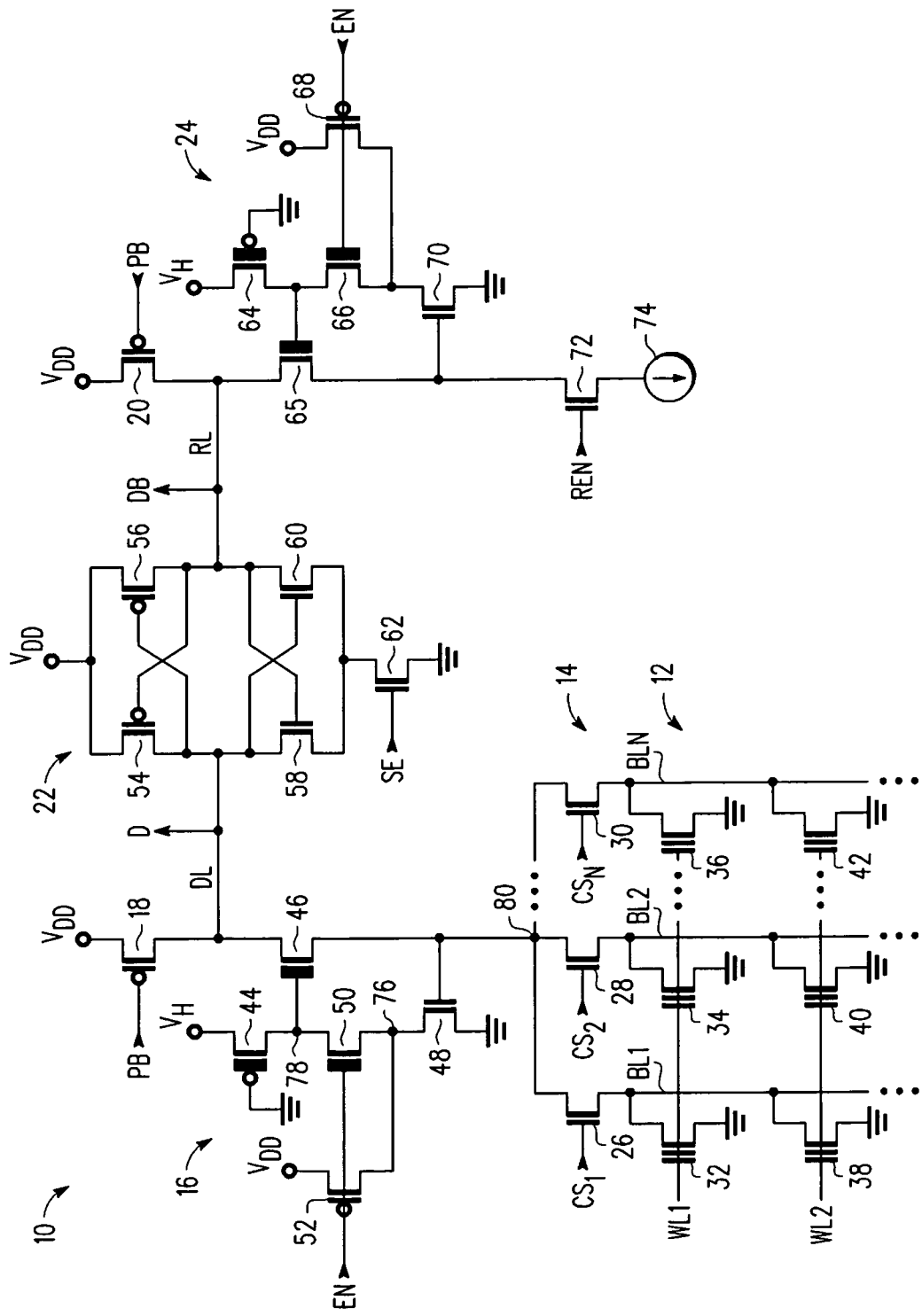
FIG. 1 is a circuit diagram of a memory according to an embodiment.

Shown in FIG. 1 is a memory 10 comprising an array 12, a column decoder 14, a regulation circuit 16, a precharge transistor 18, a precharge transistor 20, a sense amplifier 22, and a reference circuit 24. Array 12 as shown in FIG. 12 comprises memory cells 32, 34, and 36 in a row and coupled to a word line WL1 and memory cells 38, 40, and 42 in a row and coupled to a word line WL2. Memory cells in this example are non-volatile memory cells that can be programmed and/or erased using a high voltage which is received at a terminal VH. Memory cells 32 and 38 are in a column and coupled to a bit line BL1. Memory cells 34 and 40 are in a column and coupled to a bit line BL2. Memory cells 36 and 42 are in a column coupled to a bit line BLN. Array 12 has many more memory cells, rows, columns, bit lines, and word lines than those shown. Column decoder 14 comprises N channel transistors 26, 28, and 30. Transistor 26 is coupled between bit line BL1 and a node 80 and enabled by a column select signal CS1. Transistor 28 is coupled between bit line BL2 and node 80 and enabled by a column select signal CS2. Transistor 30 is coupled between bit line BLN and node 80 and enabled by column select signal CSN. Regulation circuit 16 comprises a P channel transistor 44, an N channel transistor 46, an N channel transistor 48, an N channel transistor 50, and a P channel transistor 52. Transistors 44, 46, and 50 are high voltage transistors in that they have a higher dielectric breakdown voltage than most of the other transistors including transistors 48 and 52. The lower dielectric breakdown transistors, such as transistors 48 and 52, may be called logic transistors because they are particularly good for that purpose where the voltage can be low and speed is particularly important. High voltage transistors are commonly made by having a thicker gate dielectric than the logic transistors. The result of the thicker gate dielectric is greater breakdown voltage but also typically a greater threshold voltage. The high voltage transistors are identified in FIG. 1 with the extra thickness at the gate connection.

Regulation circuit 16 is coupled together to perform a function of speeding up the precharging of a selected bit line and isolating the capacitance of array 12 from sense amplifier 22. Transistor 44 has a source connected to a positive high power supply terminal which in this example is shown as VH, a gate connected to a negative power supply terminal which in this example is shown as ground, and a drain connected to a node 78. VDD is the terminal at which is received the voltage for use by the internal logic of memory 10. Negative power supply is a power supply voltage that is lower than the voltage at VDD. VH is the terminal at which a voltage higher than the voltage at VDD and is for programming and/or erasing memory cells. Transistor 46 has a gate connected to node 78, a source connected to node 80, and a drain connected to a data line DL. Transistor 48 has a gate connected to node 80, a source connected to ground, and a drain connected to a node 76. Transistor 50 has a drain connected to node 78, a source connected to node 76, and a gate for receiving an enable signal EN. Transistor 52 has a gate for receiving enable signal EN, a source connected to VDD, and a drain connected to node 76.

Transistor 18 has a source connected to VDD, a gate for receiving a precharge signal PB, and a drain connected to the drain of transistor 46. Transistor 20 has a source connected to VDD, a gate for receiving a precharge signal PB, and a drain. Sense amplifier 22 comprises P channel transistors 54 and 56 and N channel transistors 58, 60, and 62. Sense amplifier 22 is a conventional CMOS cross coupled latch in which transistor 62 functions to enable the latching function in response to a sense amp enable signal SE. When enabled, sense amplifier 22 provides a data output D at a connection between transistors 54 and 58 and a complementary data output DB at a connection between transistor 56 and transistor 60. The node of the connection between transistors 54 and 58 which is also in common with the drains of transistors 18 and 46 may be considered a data line DL. Similarly, the node of the connection between transistors 56 and 60 which is also in common with drains of transistors 20 and 65 may be considered a reference line RL.

Reference circuit 24 comprises a P channel transistor 64, an N channel transistor 66, a P channel transistor 68, an N channel transistor 70, an N channel transistor 65, an N channel transistor 72, and a reference current source 74 that sinks current to ground. Transistor 64 has a source connected to VDD, a gate connected to ground, and a drain. Transistor 65 has a gate connected to the drain of transistor 64, a drain connected to the drain of transistor 20, and a source. Transistor 70 has a gate connected to the drain of transistor 65, a source connected to ground, and a drain. Transistor 66 has a drain connected to the gate of transistor 65, a source connected to the drain of transistor 70, and a gate for receiving enable signal EN. Transistor 68 has a gate for receiving enable signal EN, a source connected to VDD, and a drain connected to the drain of transistor 70. Transistors 64-70 are connected together in the same way as transistors 44-52 of regulation circuit 16. Transistor 72 has a drain connected to the source of transistor 65, a gate for receiving a reference enable signal REN, and a source. Current reference 74 has a terminal connected to the source of transistor 72. Current source is a reference that sinks current between the amount of current between a logic high and a logic low memory cell. For efficiency of design, an additional array not shown may be coupled to line RL and an additional reference circuit may be coupled to line DL.

Figure 2:
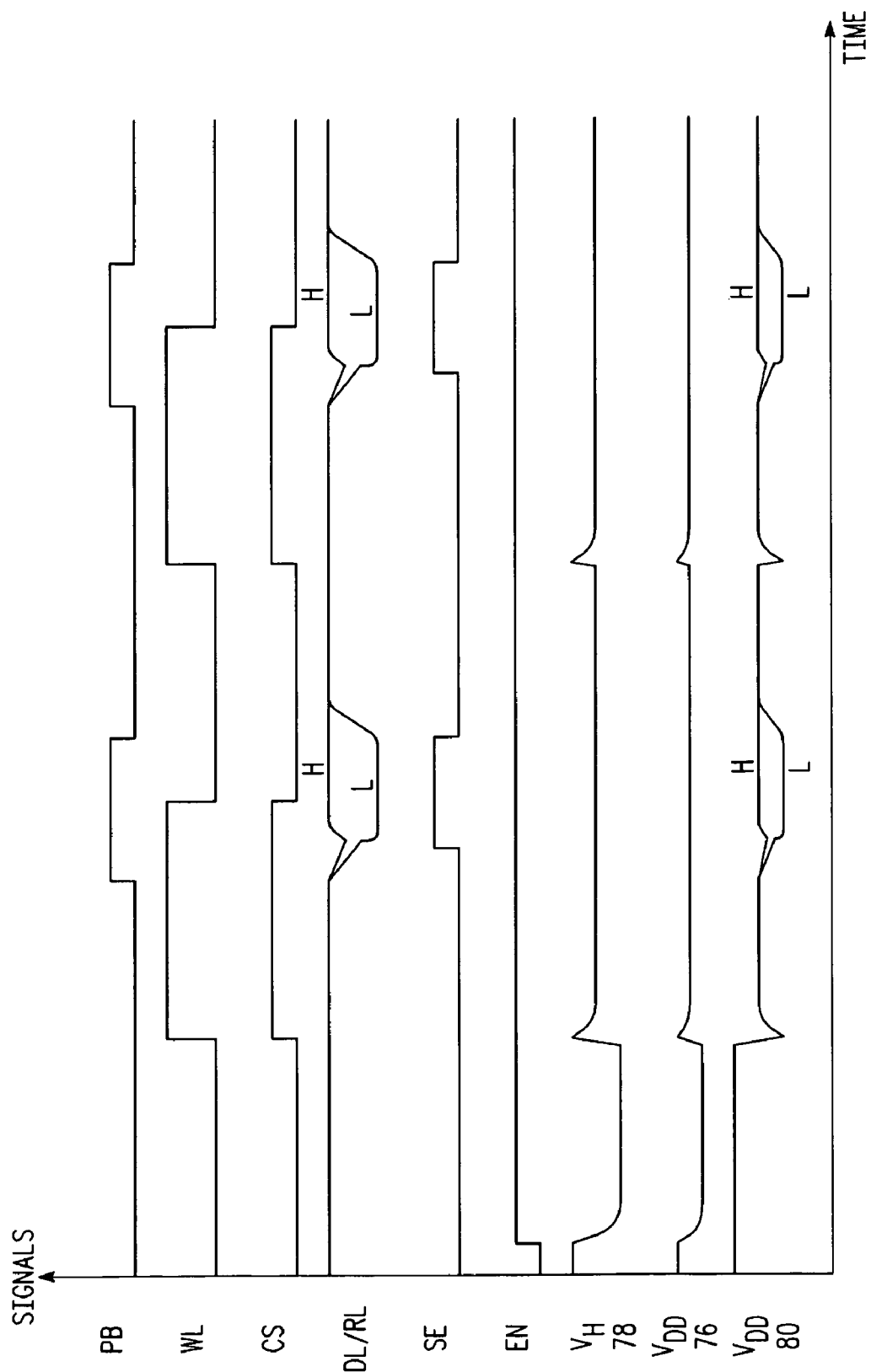
FIG. 2 is a timing diagram useful in understanding the operation of the memory of FIG. 1.

Reference is made to FIG. 2 to aid in describing the operation of memory 10. As shown in FIG. 2, assume starting conditions of precharge signal PB being a logic low, a word line enable signal WL being a logic low, a column enable signal CS being a logic low, sense amp enable signal being a low logic low, and enable signal EN being a logic low. In such conditions transistors 18 and 20 are conductive and applying VDD to data line DL and reference line RL, respectively. With enable signal EN at a logic low, transistors 50 and 66 are non-conductive and transistors 52 and 68 are conductive. Transistors 52 and 68 are thus applying VDD to the drains of transistors 48 and 70, respectively. This is shown as node 76 in FIG. 2. Transistors 44 and 64 are applying VH to the gates of transistors 46 and 65, respectively. This is shown as node 78 in FIG. 2. With the high voltage of VH applied to the gates of transistors 46 and 65, VDD is coupled to node 80 and the drain of transistor 72, respectively. With enable signal EN at a logic low, a read is not taking place.

As shown in FIG. 2, enable signal EN switches to a logic high which causes transistors 52 and 68 to become non-conductive and transistors 50 and 66 to become conductive. The result is that the transistors 44, 50, and 48 are all conductive and in series so a voltage division occurs and reduces the voltage at node 78 and causes transistor 46 to become less conductive. This is the situation in preparation for a read after a non-read operation. To begin the read, word line enable WL and column select CS become active and node 80 is coupled to a selected bit line. This has the affect of dropping the voltage at node 80 to near ground because of the large capacitance of the selected bit line. In this example assume that memory cell 32 is to be read so that word line WL1 is enabled and bit line BL1 is selected. In such case and upon column select CS being enabled, signal CS1 becomes a logic high so that transistor 26 becomes conductive. With node 80 being near ground, transistor 48 is made to be non-conductive and the gate of transistor 46 becomes VH. Because transistor 50 is receiving enable signal EN at a logic high of VDD, the maximum voltage applied to the drain of transistor 48 is VDD minus the threshold voltage of transistor 50. Transistor 48 is thus protected from receiving VH which would be damaging. With the gate of transistor 46 at VH, transistor 46 is highly conductive because its gate to source voltage greatly exceeds its threshold voltage. For example, VH could be 3.3 and the threshold voltage of transistor 46 could be about 0.7 volt. Thus, at this time, the gate to source voltage of transistor 46 exceeds the threshold voltage of transistor 46 by 3.3−0.7=2.6 volts. On the other hand, if transistor 46 were a logic transistor so that it could only handle a logic level voltage such as 1.2 volt for VDD, the gate voltage could only be 1.2 volts. Even with an unusually low threshold voltage of 0.1 volt, the threshold voltage would only be exceeded by 1.2−0.1=1.1 volt. Thus, using VH and a high voltage transistor, the threshold voltage is exceeded by 2.6 volts versus only 1.1 volts for the logic transistor. The result is that node 80 and bit line BL1 is charged to the desired voltage must faster than if a logic device were used.

As node 80 rises in voltage, the threshold voltage, typically 0.2 to 0.3 volt, of transistor is exceeded, transistor 48 begins becoming conductive. This begins dropping the voltage on node 78, the gate of transistor 46. Very quickly the voltage on node 80 stabilizes at the desired bit line voltage that can be chosen based on the voltage division of transistors 44, 50, and 48. The sizes of transistors 44, 50, and 48 can be ratioed to achieve the desired bias level. The time for reaching the desired bias is faster by using high voltage transistor 46 biased by VH than for a logic transistor biased by VDD. Thus, after the desired bias is reached on node 80 and the selected bit line, precharge signal PB can switch to a logic high and transistors 18 and 20 become non-conductive. This allows data line DL and reference line RL to begin separating. After sufficient time from disabling the precharge signal, sense enable SE is enabled so that sense amplifier 22 latches the data based on the separation on data line DL and reference line RL. The latching by sense amplifier 22 causes outputs D and DB on data line DL and reference line RL, respectively, to be at the full rails of the power supply, VDD and ground. Upon providing outputs D and DB, these signals can be latched elsewhere and used as needed.

Memory 10 can proceed with another read. This begins by terminating the previous read by disabling sense amplifier 22 by deasserting signal SE followed by asserting activating precharge signal PB. This again causes data line DL and reference line RL to be at VDD. Node 80 will be at the desired bias level due to transistor 50 being conductive. Thus, the ratio of transistors 44, 50, 48 controls the voltage of node 80. After data line DL and reference line RL have stabilized at VDD, column select CS and word line enable signal WL can be activated. This causes the selected word line to be enabled and the selected bit line to be coupled to node 80. Assume in this second read that the selected memory cell is memory cell 40 so that word line WL2 and column select signal CS2 are both brought to a logic high. The immediate affect is for node 80 to drop to near ground due to the capacitive loading of bit line BL2. As before this causes transistor 48 to become non-conductive allowing transistors 44 to apply VH to the gates of transistor 46. This again puts transistors 46 and 65 into a highly conductive state so that the desired voltage is quickly present on node 80 as well as at the drain of transistor 72. Based on the ratios of transistors 44, 50, and 48 the desired voltage is achieved at node 80. The precharge is discontinued, some separation between data line DL and reference line RL occurs, and sense amplifier 22 latches the data in response to the subsequent assertion of sense amp enable SE. The speed of sensing is enhanced by virtue of the ability to increase the bias on transistor 46 at the time at which node 80 is pulled to near ground by being coupled to the selected bit line. This recovery time is faster by using the high voltage device accompanied by the high voltage VH.

Figure 3:
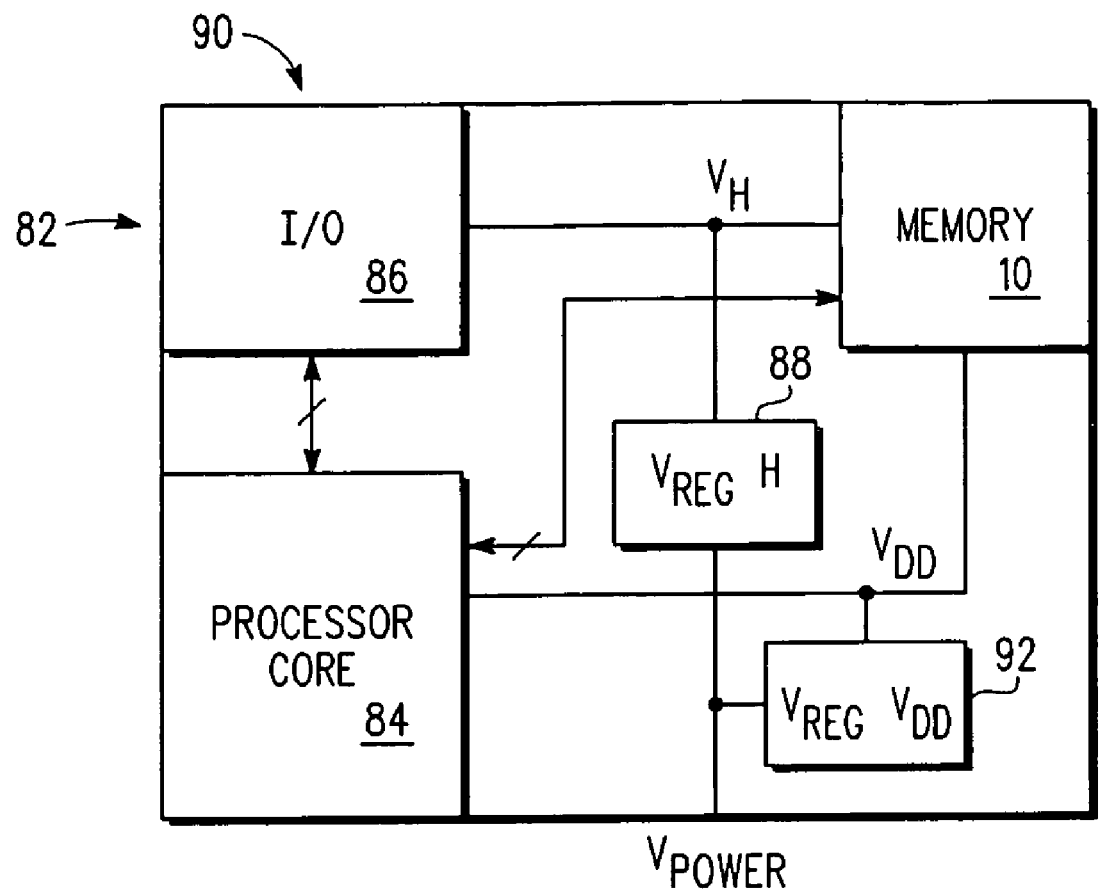
FIG. 3 is a system that is particularly suited for the memory of FIG. 1.

Shown in FIG. 3 is a system 82 comprising a processor core 84, an I/O 86 having an external interface 90, a voltage regulator VREG H 88 that provides high voltage VH, a voltage regulator VREG VDD that provides logic power supply voltage VDD, and memory 10. As shown VDD is provided to memory 10 and core processor 84. Also, VH is provided to memory 10 and I/O 86. I/O 86 comprises high voltage transistors for handling the high voltage VH required for receiving and providing signals at the external interface. For normal operations, processor 84 uses memory 10 and uses I/O 86 for sending and receiving data external to system 82. Memory 10 and regulation circuit 16 therein are particularly beneficial in a system like system 82 which already requires the high voltage transistors and the high voltage VH.

By now it should be appreciated that there has been provided a memory having an array of memory cells, a sense amplifier, a data line, a bit line segment, and a regulation circuit. The data line is coupled to a sense amplifier and provides a signal indicative of a value stored in a memory cell of the array during at least a portion of read operation, wherein the data line is precharged at a first voltage during a precharge operation. The bit line segment is coupled to a memory cell of the memory array during at least a portion of a read operation of the memory cell. The regulation circuit has a first transistor, a second transistor, and a third transistor. The first transistor has a first current electrode connected to the data line, a second current electrode connected to the bit line segment, and a control electrode. The second transistor has a control electrode connected to the second current electrode of the first transistor. The third transistor has a first current electrode connected to the control electrode of the first transistor and a second current electrode connected to a first current electrode of the second transistor. A first current electrode of the third transistor is coupled to a second voltage source during at least a portion of a memory read operation. The second voltage source is configured to provide a higher voltage than the first voltage during a memory read operation. The control electrode of the first transistor is biased at a higher voltage level than the first voltage during at least a portion of a read operation of a memory cell of the array. The memory may be further characterized by the sense amplifier including a plurality of transistors in which the plurality of transistors each have a dielectric breakdown voltage of a first breakdown voltage level and the first transistor and the third transistor each have a dielectric breakdown voltage that is higher than the first breakdown voltage level. The memory may be further characterized by the second transistor having a dielectric breakdown voltage of the first breakdown voltage level. The memory may further comprise a fourth transistor in which the fourth transistor has a control electrode connected to the control electrode of the third transistor, a first current electrode connected to the second current electrode of the third transistor, and a second current electrode coupled to a voltage source providing the first voltage. The memory may be further characterized by the fourth transistor being of an opposite conductivity type as the third transistor and having a lower dielectric break down voltage than the third transistor. The memory may further comprise a plurality of column select transistors in which each transistor of the plurality of column select transistors has a first current electrode connected to bit line segment and a second current electrode coupled to a column of memory cells of a plurality of columns of memory cells of the array, wherein when made conductive, each transistor of the plurality of column select transistors couples its column of memory cells of the plurality of columns of memory cells to the bit line segment. The memory may be further characterized by each of the plurality of column select transistors having a dielectric breakdown voltage less than a dielectric breakdown voltage of the first transistor. An electronic system may include the memory and the electronic system may further include a processor core and I/O circuitry, wherein the I/O circuitry includes circuitry configured to operate in a voltage domain of a voltage level provided by the second voltage source. The memory may further include a fourth transistor having a first current electrode coupled to the second voltage source and a second current electrode coupled to the first current electrode of the third transistor. The memory may be further characterized by, during a memory read operation, the second current electrode being at a voltage that is no higher than a third voltage level, the third voltage level being less than the first voltage, and the third voltage level being dependent upon a threshold voltage of the second transistor. The memory may be further characterized by the sense amplifier including a first input coupled to the data line and a second input and the memory further including a second data line coupled to the second input of the sense amplifier that is precharged at the first voltage during a precharge operation and a second regulation circuit that includes a fourth transistor having a first current electrode connected to the second data line and a control electrode, a fifth transistor, the fifth transistor having a control electrode connected to a second current electrode of the fourth transistor, and a sixth transistor having a first current electrode connected to the control electrode of the fourth transistor and a second current electrode connected to a first current electrode of the fifth transistor, wherein a first current electrode of the sixth transistor is coupled to the second voltage source during at least a portion of a memory read operation and the control electrode of the fourth transistor is biased at a higher voltage level than the first voltage during at least a portion of a read operation of a memory cell of the memory array.

Also described is a method of reading a memory cell of a memory. The method includes precharging a data line to a first voltage value. The method further includes biasing a control electrode of a first transistor at a voltage value greater than the first voltage value during at least a portion of the precharging, the first transistor having a first current electrode connected to the data line. The method further includes coupling a memory cell of a memory array to a second current electrode of the first transistor, the data line is coupled to the memory cell by the first transistor for receiving a signal indicative of a value stored in the memory cell. The method may further comprise providing by the data line a signal to a sense amplifier of the memory indicative of the value stored in the memory cell. The method may be further characterized by the precharging including coupling the data line to a voltage source and the method further comprising decoupling the data line from the voltage source while the data line is coupled to the memory cell by the first transistor, wherein the voltage value of the data line after the decoupling is dependent upon the value stored in the memory cell. The method may be further characterized by, after the data line is decoupled from the voltage source, decoupling the data line from the memory cell while a sense enable signal is asserted to a sense amplifier coupled to the data line. The method may further comprise sensing a difference between a signal on the data line and a reference signal from a second data line, wherein the second data line is connected to a first current electrode of a second transistor and biasing a control electrode of a second transistor at the voltage value during at least a portion of the precharging in which, during at least a portion of a read operation, a reference circuit is coupled to a second current electrode of the second transistor, the second data line is coupled to the reference circuit by the second transistor. The method may be further characterized by, during at least a portion of the precharging, limiting the voltage of the second current electrode of the first transistor to a second voltage value that is less than the first voltage value, wherein the second voltage value is dependent upon a threshold voltage of a second transistor and a control electrode of the second transistor is connected to a second current electrode of the first transistor. The method may be further characterized by the data line being coupled to a sense amplifier and the sense amplifier having a first plurality of transistors in which each of the first plurality of transistors has a dielectric breakdown voltage that is less than a dielectric breakdown voltage of the first transistor.

Described also is memory having an array of cells, a sense amplifier including a first plurality of transistors, a data line, a bit line segment, and a regulation circuit. The data line is coupled to the sense amplifier for providing a signal indicative of a value stored in a memory cell of the array during at least a portion of a read operation, wherein the data line is precharged at a first voltage during a precharge operation. The bit line segment is coupled to a memory cell of the array during at least a portion of a read operation of the memory cell. The regulation circuit includes first, second, and third transistors. The first transistor has a first current electrode connected to the data line, a second current electrode connected to the bit line segment, and a control electrode. The second transistor has a control electrode connected to the second current electrode of the first transistor. The third transistor has a first current electrode connected to the control electrode of the first transistor and a second current electrode connected to a first current electrode of the second transistor, wherein a first current electrode of the third transistor is coupled to a second voltage source during at least a portion of a memory read operation. The first transistor and the third transistor each have a higher dielectric breakdown voltage than a dielectric breakdown voltage of each of the first plurality of transistors. The memory may be further characterized by the first transistor and the third transistor each having a dielectric breakdown voltage greater than a dielectric breakdown voltage of the second transistor.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention. N and P channel transistors have gates, sources, and drains. The gates function as a control electrode. The sources and drains are generally constructed to be interchangeable and the difference between a source and drain depends upon the function within a circuit. Thus, P and N channel transistors are considered to have two current electrodes and a control electrode.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, the memory cells are shown as floating gate memory cells and described as memory cells that are programmable and erasable. Another type of memory, such as a ROM, may be found to be able to be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory comprising:
   an array of memory cells;
   a sense amplifier;
   a data line coupled to a sense amplifier for providing a signal indicative of a value stored in a memory cell of the array during at least a portion of read operation, wherein the data line is precharged at a first voltage during a precharge operation;
   a bit line segment, the bit line segment coupled to a memory cell of the memory array during at least a portion of a read operation of the memory cell;
   a regulation circuit, the regulation circuit including:
      a first transistor having a first current electrode connected to the data line, a second current electrode connected to the bit line segment, and a control electrode;
      a second transistor, the second transistor having a control electrode connected to the second current electrode of the first transistor;
      a third transistor, the third transistor having a first current electrode connected to the control electrode of the first transistor and a second current electrode connected to a first current electrode of the second transistor, wherein a first current electrode of the third transistor is coupled to a second voltage source during at least a portion of a memory read operation, wherein the second voltage source is configured to provide a higher voltage than the first voltage during a memory read operation;

wherein the control electrode of the first transistor is biased at a higher voltage level than the first voltage during at least a portion of a read operation of a memory cell of the array.

2. The memory of claim 1 wherein:
the sense amplifier includes a plurality of transistors, the plurality of transistors each having dielectric breakdown voltage of a first breakdown voltage level, wherein the first transistor and the third transistor each have a dielectric breakdown voltage that is higher than the first breakdown voltage level.

3. The memory of claim 2:
wherein the second transistor has a dielectric breakdown voltage of the first breakdown voltage level.

4. The memory of claim 1 further comprising:
a fourth transistor, the fourth transistor having a control electrode connected to the control electrode of the third transistor, the fourth transistor having a first current electrode connected to the second current electrode of the third transistor, the fourth transistor having a second current electrode coupled to a voltage source providing the first voltage.

5. The memory of claim 4 wherein the fourth transistor is of an opposite conductivity type as the third transistor, wherein the fourth transistor has a lower dielectric break down voltage than the third transistor.

6. The memory of claim 1 further comprising:
a plurality of column select transistors, each transistor of the plurality of column select transistors having a first current electrode connected to bit line segment, wherein each transistor of the plurality having a second current electrode coupled to a column of memory cells of a plurality of columns of memory cells of the array, wherein when made conductive, each transistor of the plurality of column select transistors couples its column of memory cells of the plurality of columns of memory cells to the bit line segment.

7. The memory of claim 6 wherein each of the plurality of column select transistors has a dielectric breakdown voltage less than a dielectric breakdown voltage of the first transistor.

8. An electronic system comprising the memory of claim 1 and further comprising a processor core and I/O circuitry, wherein the I/O circuitry includes circuitry configured to operate in a voltage domain of a voltage level provided by the second voltage source.

9. The memory of claim 1 further comprising:
a fourth transistor having a first current electrode coupled to the second voltage source and a second current electrode coupled to the first current electrode of the third transistor.

10. The memory of claim 1 wherein during a memory read operation, the second current electrode is at a voltage that is no higher than a third voltage level, wherein the third voltage level is less than the first voltage, wherein the third voltage level is dependent upon a threshold voltage of the second transistor.

11. The memory of claim 1 wherein the sense amplifier includes a first input coupled to the data line and a second input, the memory further comprising:
a second data line coupled to the second input of the sense amplifier, wherein the second data line is precharged at the first voltage during a precharge operation; and
a second regulation circuit, the second regulation circuit including:
a fourth transistor having a first current electrode connected to the second data line and a control electrode;
a fifth transistor, the fifth transistor having a control electrode connected to a second current electrode of the fourth transistor; and
a sixth transistor, the sixth transistor having a first current electrode connected to the control electrode of the fourth transistor and a second current electrode connected to a first current electrode of the fifth transistor, wherein a first current electrode of the sixth transistor is coupled to the second voltage source during at least a portion of a memory read operation;
wherein the control electrode of the fourth transistor is biased at a higher voltage level than the first voltage during at least a portion of a read operation of a memory cell of the memory array.

12. A method of reading a memory cell of a memory, the method comprising:
precharging a data line to a first voltage value;
biasing a control electrode of a first transistor at a voltage value greater than the first voltage value during at least a portion of the precharging, the first transistor having a first current electrode connected to the data line; and
coupling a memory cell of a memory array to a second current electrode of the first transistor, the data line is coupled to the memory cell by the first transistor for receiving a signal indicative of a value stored in the memory cell.

13. The method of claim 12 further comprising:
providing by the data line a signal to a sense amplifier of the memory indicative of the value stored in the memory cell.

14. The method of claim 12 wherein:
the precharging includes coupling the data line to a voltage source; and
the method further comprises decoupling the data line from the voltage source while the data line is coupled to the memory cell by the first transistor, wherein the voltage value of the data line after the decoupling is dependent upon the value stored in the memory cell.

15. The method of claim 14 wherein:
after the data line is decoupled from the voltage source, decoupling the data line from the memory cell while a sense enable signal is asserted to a sense amplifier coupled to the data line.

16. The method of claim 12 further comprising:
sensing a difference between a signal on the data line and a reference signal from a second data line, wherein the second data line is connected to a first current electrode of a second transistor; and
biasing a control electrode of a second transistor at the voltage value during at least a portion of the precharging;
wherein during at least a portion of a read operation, a reference circuit is coupled to a second current electrode of the second transistor, the second data line is coupled to the reference circuit by the second transistor.

17. The method of claim 12 wherein during at least a portion of the precharging, limiting the voltage of the second current electrode of the first transistor to a second voltage value that is less than the first voltage value, wherein the second voltage value is dependent upon a threshold voltage of a second transistor, a control electrode of the second transistor is connected to a second current electrode of the first transistor.

18. The method of claim 12 wherein the data line is coupled to a sense amplifier, the sense amplifier has a first plurality of transistors, wherein each of the first plurality of transistors has a dielectric breakdown voltage that is less than a dielectric breakdown voltage of the first transistor.

* * * * *